CURRENT MODULATED FIELD EFFECT TRANSISTOR

Filed Oct. 4, 1965

INVENTORS
SVEN A. ROOSILD
BOBBY L. BUCHANAN
RUSSELL P. DOLAN JR.
BY Harry A. Herbert Jr. and
Julian L. Siegel
ATTORNEYS INVENTORS
SVEN A. ROOSILD
BOBBY L. BUCHANAN
RUSSELL P. DOLAN Jr.
BY Harry A. Herbert Jr.
Julian L. Siegel
ATTORNEYS INVENTORS
SVEN A. ROOSILD
BOBBY L. BUCHANAN
RUSSELL P. DOLAN Jr.
BY Harry A. Herbert Jr. and
Julian L. Siegel
ATTORNEYS INVENTORS
SVEN A. ROOSILD
BOBBY L. BUCHANAN
RUSSELL P. DOLAN Jr.
BY Harry A. Herbert Jr. and
Julian L. Siegel
ATTORNEYS

United States Patent Office 3,430,113
Patented Feb. 25, 1969

3,430,113

CURRENT MODULATED FIELD EFFECT TRANSISTOR

Sven A. Roosild, Billerica, Bobby L. Buchanan, Carlisle, and Russell P. Dolan, Jr., Concord, Mass., assignors to the United States of America as represented by the Secretary of the Air Force Filed Oct. 4, 1965, Ser. No. 492,954
U.S. Cl. 317—235 5 Claims
Int. Cl. H01l 11/00, 15/00

ABSTRACT OF THE DISCLOSURE

A unipolar transistor having a channel approximately pinched off at zero bias and having an increasing channel current with a forward gate bias with a portion of the source to drain semiconductor material in an extended volcano-shaped configuration.

The invention described herein may be manufactured and used by or for the United States Government for governmental purposes without payment to us of any royalty thereon.

This invention relates to a small current amplifying device and more particularly to a field effect or unipolar transistor.

Unlike conventional transistors the measured characteristics of this invention show that the current gain increases as current decreases below one microampere input signal level. This device utilizes the field effect transistor amplification technique where the current flow in a semiconductor channel can be modulated by modulating the surrounding space charge region. However, this device differs from the conventional field effect transistor because the channel is initially blocked by the natural depletion regions extending from the gate junctions into the channel; a forward bias is applied to the gates which causes the depletion regions to recede thereby opening the channel for conduction; and the geometry of the channel is neither rectangular nor concentric but has an extended volcano-like configuration.

It is therefore an object of this invention to provide a device that amplifies very low current signals.

It is another object to provide a device that amplifies current at room temperature as well as at very low temperatures where bipolar devices fail.

It is still another object to provide an amplifier that shows less permanent damage from steady state radiation than normal bipolar devices.

It is yet another object to provide an amplifier that consumes no power, if there is no applied input signals.

These and other advantages, features and objects of the invention will become more apparent from the following description taken in connection with the illustrative embodiment in the accompanying drawing wherein.

Figures 1, 2:
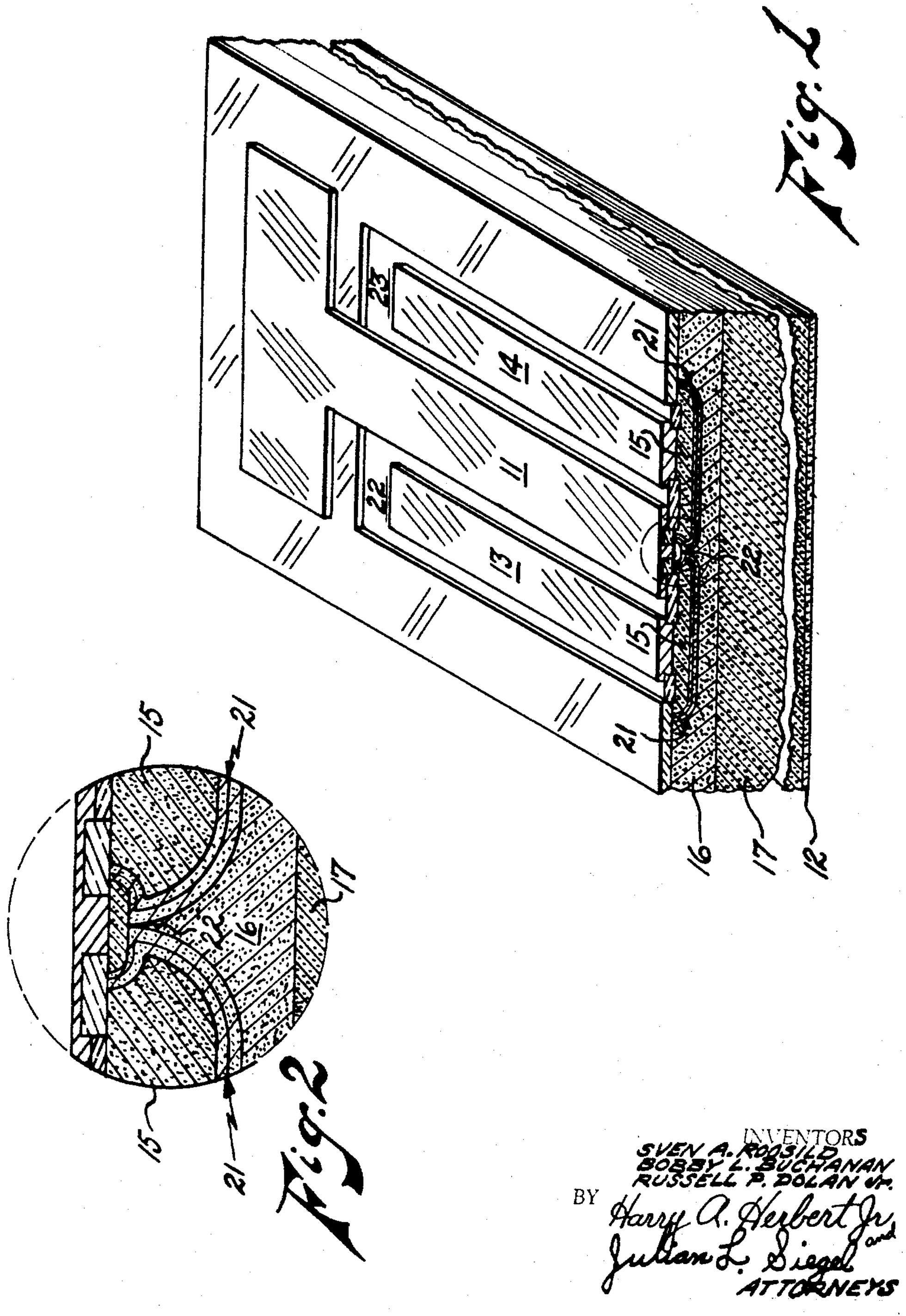
FIGURE 1 is a schematic isometric view partly in cross-section of the amplifying device.
FIGURE 2 shows an enlarged portion of the channel area in cross-section.

Referring to FIGURE 1 showing a schematic presentation of the invention, a source of potential can be applied to source contact 11 and drain contact 12. Gate contacts 13 and 14 are connected to p-type material 15 which forms a p-n junction with n-type material 16, which is of high resistivity at about 6Ω-cm. in an epitaxial layer having a width of about 20 microns. The source, drain, and gate contacts can be constructed of aluminum. Substrate 17, a low resistivity material of about .01Ω-cm. is used to give the device rigidity.

FIGURE 2 shows in greater detail the channel geometry. Under zero bias the device has a space charge or depletion area shown at 21 and is pinched off at 22. It is not necessary that the channel be completely pinched off at zero bias but this represents an optimum condition.

Figure 3:
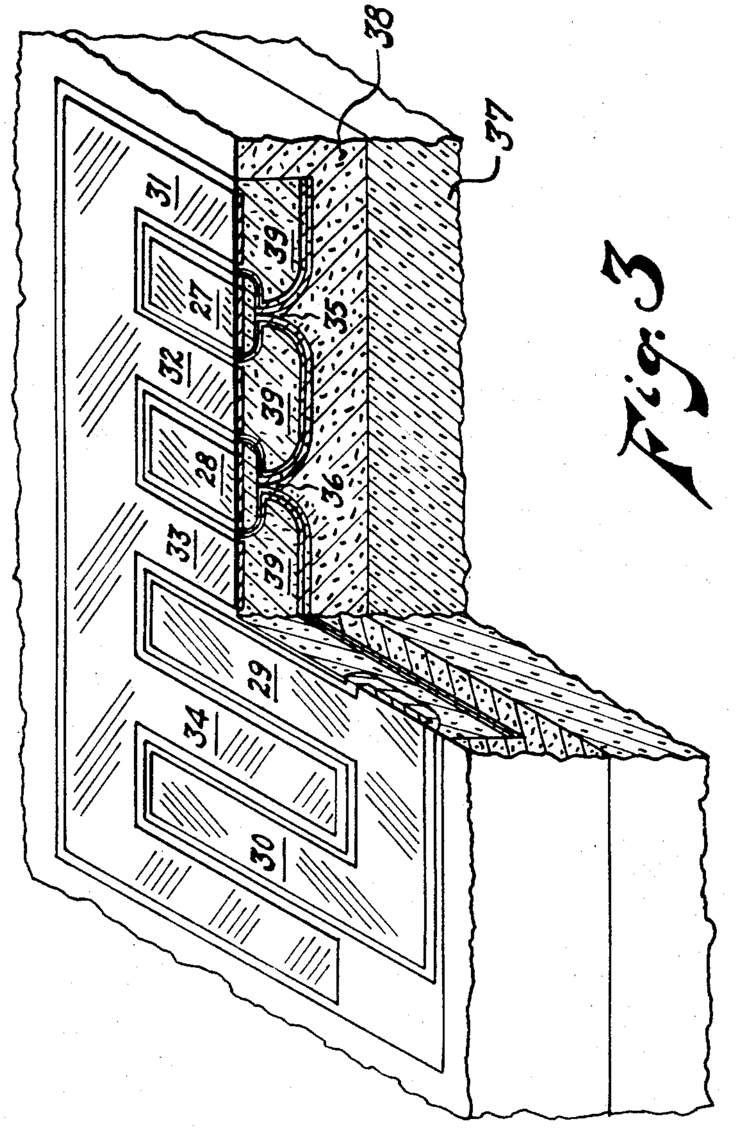
FIGURE 3 shows a fragmentary schematic isometric view partly in cross-section of the amplifying device using multiple channels.

FIGURE 3 shows how the invention can be used with a plurality of channels. Gate contacts 31, 32, 33, and 34 control current flow through channels 35, 36, etc., formed by n-material 38 and p-material 39. Source contacts are shown at 27, 28, 29, and 30. Substrate 37, a low resistivity material, is added for rigidity. This multiple arrangement offers a greater power output.

Figure 4:
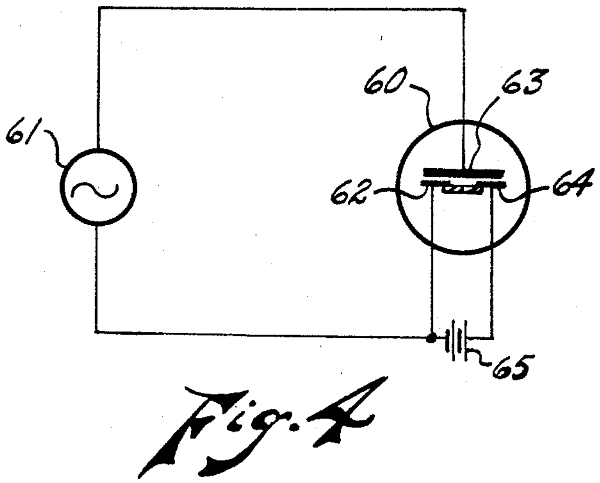
FIGURE 4 shows a circuit diagram for the invention.

Referring to FIGURE 4 showing a circuit diagram for transistor 60, a signal source 61 is connected to source 62 and gate 63. Potential source 65 is connected between source 62 and drain 64. Unlike conventional unipolar devices the present invention utilizes a gate current instead of merely controlling the transistor by gate voltage.

The method of fabrication is based on utilization of lateral diffusion. The lateral diffusion process leads to a junction and channel geometry to which a good approximation is shown in FIGURE 2. When using silicon as the basic crystal material, narrow silicon dioxide masking strips are formed by photomasking and subsequent etching to cover the areas intended for channel 22 in preparation for a boron diffusion. The boron then diffuses into the silicon not only downward but also laterally under the silicon dioxide strip forming p-type material 15. The total diffusion area is kpet to a minimum to limit gate capacitance. Since the lateral diffusion determines the ultimate width of the channels, it is possible to accurately control this critical dimension through the known relationship that exists between the lateral spread and the depth of the diffusion. The device can be fabricated by diffusing boron at a surface concentration of $2\times10^{20}$ atoms/cc. to a depth of $9.5\pm.25$ microns. A second diffusion of phosphorus is performed so as to facilitate contacting the top of the channel.

Figure 5:
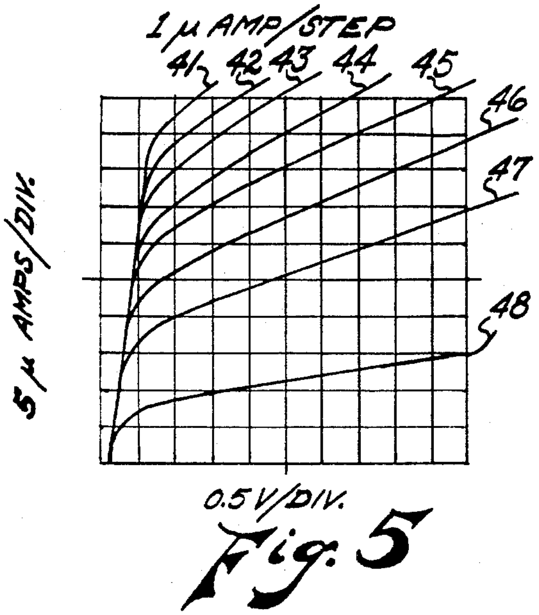
FIGURE 5 is a characteristic curve taken at room temperatures.
Figure 6:
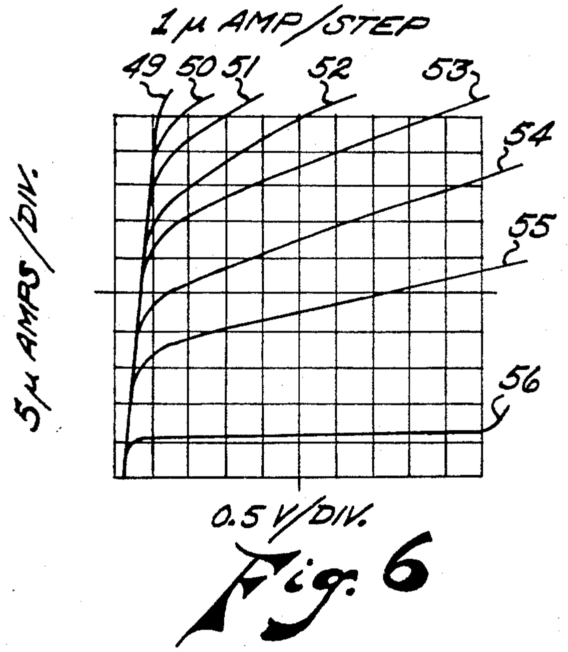
FIGURE 6 is a characteristic curve taken at 77° K.

The electrical characteristics of this device are shown in FIGURES 5 and 6 showing the gain at room temperature and at 77° K. The abscissa represents the potential difference between the source and drain while the ordinate represents the source to drain current. The family of curves 41 to 48 and 49 to 56 are taken at microampere steps representing various values of gate current. The highest performance at room temperature is obtained when the gates are biased at a forward potential between .3 and .6 volt and the input signal is small. Above this value the drop in input resistance degrades the performance. The amplifying characteristics are best observed when the signal is taken from a constant current generator. If we choose to interpret the short circuit forward current gain as $\beta$, in an analogy to bipolar transistors, we note that this $\beta$ increases monotonically as the input signal is decreased. Therefore, the device has applications in which very small signals need to be amplified and can be used in place of conventional bipolar transistors.

Figure 7:
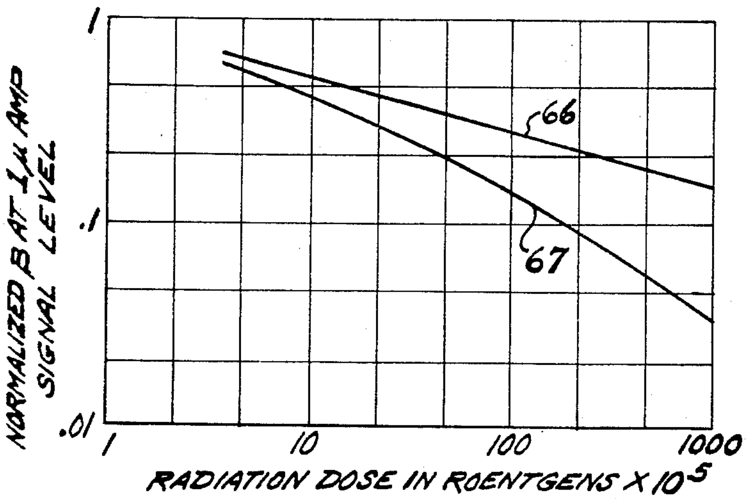
FIGURE 7 shows curves pointing out the advantage of this device under the effect of radiation.

Referring to FIGURE 7 showing the graph indicating resistance to permanent damage from radiation, 66 represents a curve for the present invention while 67 represents a curve for a representative bipolar transistor. It is seen that the present invention is relatively more resistant to permanent damage then the bipolar device. This is expected since the device does not require minority carriers to drift through a base region without recombination. Thus, a decrease in lifetime does not effect this device as adversely as it effects a normal bipolar device.

What we claim is:

1. A unipolar transistor comprising:
(a) a source contact;
(b) a drain contact;
(c) a first body of semiconductor material of one conductivity type interposed between the source and drain contacts and having a portion of the material in an extended volcano-shaped configuration;
(d) gate contacts connected to the transistor on both sides of the portion of semiconductor material having an extended volcano-shaped configuration; forming channels approximately pinched-off at zero bias and having an increasing channel current with forward gate bias.
(e) and a second body of semiconductor material interposed between the gate contacts, the material of the second body having a conductivity type opposite to the material of the first body and forming a p-n junction therewith.

2. A unipolar transistor comprising:
(a) a source contact;
(b) a drain contact;
(c) a body of n-type material interposed between the source and drain contacts and having a portion thereof in an extended volcano-shaped configuration;
(d) gate contacts connected to the transistor on both sides of the portion having an extended volcano-shaped configuration; forming a channel approximately pinched-off at zero gate bias and having increasing channel current with forward bias;
(e) and a body of p-type material surrounding the portion of n-type material that has an extended volcano-shaped configuration and forming a p-n junction therewith.

3. A unipolar transistor comprising:
(a) a plurality source contacts;
(b) a plurality of drain contacts;
(c) a first body of semiconductor material of one conductivity type having a plurality of extended volcano-shaped configurations interposed between the source and drain contacts;
(d) a plurality of gate contacts connected to the transistor on both sides of the portions of semiconductor materials having an extended volcano-shaped configuration; forming channels approximately pinched-off at zero bias and having an increasing channel current with forward gate bias.
(e) and a plurality of semiconductor bodies interposed between the gate contacts and having a conductivity type opposite to the first body and forming a p-n junction therewith.

4. A unipolar transistor comprising:
(a) a source contact;
(b) a drain contact;
(c) a first body of semiconductor material of one conductivity type interposed between the source and drain contacts and having a portion of the material in an extended volcano-shaped configuration, wherein the volcano-shaped configuration is such that the apex is in proximity to the source contact and the area of the volcano-shaped configuration increases at an increasing rate in the direction of the drain contact;
(d) gate contacts having a current flow during operation and connected to the transistor on both sides of the portion of semiconductor material having an extended volcano-shaped configuration; forming a channel approximately pinched-off at zero gate bias and having increasing channel current with forward bias; and
(e) a second body of semiconductor material interposed between the gate contacts, the material of the second body having a conductivity type opposite to the material of the first body and forming a p-n junction therewith.

5. A unipolar transistor comprising:
(a) a plurality of source contacts;
(b) a plurality of drain contacts;
(c) a first body of semiconductor material of one conductivity type having a plurality of extended volcano-shaped configurations and drain contacts, wherein the configurations are such that the apex is in proximity to the source contacts and the area of the configurations increases at an increasing rate in the direction of the drain contacts;
(d) a plurality of gate contacts having a current flow during operation and connected to the transistor on both sides of the portions of semiconductor material having extended volcano-shaped configurations; forming channels approximately pinched-off at zero bias and having an increasing channel current with forward gate bias; and
(e) a plurality of semiconductor bodies interposed between the gate contacts, and having a conductivity type opposite to the first body and forming a p-n junction therewith.

References Cited

UNITED STATES PATENTS

| | | | |
|---|---|---|---|
| 2,930,950 | 3/1960 | Teszner | 317—235 |
| 2,954,307 | 9/1960 | Shockley | 317—235 |
| 3,025,438 | 3/1962 | Wegener | 317—235 |
| 3,126,505 | 3/1964 | Shockley | 317—235 |
| 3,227,896 | 1/1966 | Teszner | 317—235 |
| 3,252,003 | 5/1966 | Schmidt | 317—235 |
| 3,274,461 | 9/1966 | Teszner | 317—235 |

FOREIGN PATENTS

| | | |
|---|---|---|
| 1,156,898 | 11/1963 | Germany. |
| 1,377,330 | 9/1964 | France. |

OTHER REFERENCES

Roosild, Dolan, Jr. and O'Neil, A Unipolar Structure Applying Lateral Diffusion, Proceedings of the IEEE, July 1963, pp. 1059–1060.

JOHN W. HUCKERT, *Primary Examiner.*

R. F. POLISSACK, *Assistant Examiner.*

U.S. Cl. X.R.

307—299, 303, 304; 317—234